(12) United States Patent
Hatade et al.

(10) Patent No.: US 7,777,279 B2
(45) Date of Patent: *Aug. 17, 2010

(54) SEMICONDUCTOR DEVICE CAPABLE OF AVOIDING LATCHUP BREAKDOWN RESULTING FROM NEGATIVE VARIATION OF FLOATING OFFSET VOLTAGE

(75) Inventors: Kazunari Hatade, Tokyo (JP); Hajime Akiyama, Tokyo (JP); Kazuhiro Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 92 days.

This patent is subject to a terminal disclaimer.

(21) Appl. No.: 12/164,696

(22) Filed: Jun. 30, 2008

(65) Prior Publication Data

US 2008/0265334 A1 Oct. 30, 2008

Related U.S. Application Data

(62) Division of application No. 11/623,806, filed on Jan. 17, 2007, now Pat. No. 7,408,228, which is a division of application No. 11/229,724, filed on Sep. 20, 2005, now Pat. No. 7,190,034, which is a division of application No. 10/762,340, filed on Jan. 23, 2004, now Pat. No. 6,979,850.

(30) Foreign Application Priority Data

Mar. 27, 2003 (JP) ............................. 2003-087822

(51) Int. Cl.
*H01L 29/76* (2006.01)
*H01L 29/94* (2006.01)

(52) U.S. Cl. ............... 257/369; 257/371; 257/E27.064; 257/E21.632

(58) Field of Classification Search ................. 257/369, 257/371, E27.064, E21.632
See application file for complete search history.

(56) References Cited

U.S. PATENT DOCUMENTS 4,302,875 A 12/1981 Satou et al.
4,922,317 A 5/1990 Mihara (Continued)

FOREIGN PATENT DOCUMENTS

DE 103 22 742 2/2004
EP 0 382 865 8/1990

(Continued)

OTHER PUBLICATIONS

U.S. Appl. No. 12/164,739, filed Jun. 30, 2008, Hatade et al.

*Primary Examiner*—Ngan Ngo
(74) *Attorney, Agent, or Firm*—Oblon, Spivak, McClelland, Maier & Neustadt, L.L.P.

(57) ABSTRACT

A semiconductor device is provided which is capable of avoiding malfunction and latchup breakdown resulting from negative variation of high-voltage-side floating offset voltage (VS). In the upper surface of an n-type impurity region, a $p^+$-type impurity region is formed between an NMOS and a PMOS and in contact with a p-type well. An electrode resides on the $p^+$-type impurity region and the electrode is connected to a high-voltage-side floating offset voltage (VS). The $p^+$-type impurity region has a higher impurity concentration than the p-type well and is shallower than the p-type well. Between the $p^+$-type impurity region and the PMOS, an $n^+$-type impurity region is formed in the upper surface of the n-type impurity region. An electrode resides on the $n^+$-type impurity region and the electrode is connected to a high-voltage-side floating supply absolute voltage (VB).

5 Claims, 14 Drawing Sheets

U.S. PATENT DOCUMENTS

| | | | |
|---|---|---|---|
| 6,066,523 | A | 5/2000 | Shim et al. |
| 6,255,153 | B1 | 7/2001 | Ryoo |
| 6,329,694 | B1 | 12/2001 | Lee et al. |
| 6,465,283 | B1 | 10/2002 | Chang et al. |
| 6,864,525 | B2 | 3/2005 | Kaneko et al. |
| 6,864,543 | B2 | 3/2005 | Kaneko et al. |
| 6,881,997 | B2 | 4/2005 | Kaneko et al. |
| 6,927,442 | B2 | 8/2005 | Kaneko et al. |
| 6,967,132 | B2 | 11/2005 | Gonzalez et al. |
| 6,979,850 | B2 * | 12/2005 | Hatade ................ 257/296 |
| 7,190,034 | B2 * | 3/2007 | Hatade et al. ............ 257/371 |
| 7,408,228 | B2 * | 8/2008 | Hatade et al. ............ 257/369 |
| 2002/0063298 | A1 | 5/2002 | Wang |
| 2002/0195659 | A1 | 12/2002 | Jimbo et al. |
| 2005/0045964 | A1 | 3/2005 | Henmi et al. |

FOREIGN PATENT DOCUMENTS

| | | |
|---|---|---|
| EP | 1 096 573 | 5/2001 |
| JP | 52-11870 | 1/1977 |
| JP | 60-74560 | 4/1985 |
| JP | 61-97858 | 5/1986 |
| JP | 61-248459 | 11/1986 |
| JP | 62-120063 | 6/1987 |
| JP | 63-245939 | 10/1988 |
| JP | 64-28862 | 1/1989 |
| JP | 64-028940 | 1/1989 |
| JP | 64-77157 | 3/1989 |
| JP | 1-208860 | 8/1989 |
| JP | 3-96272 | 4/1991 |
| JP | 4-312968 | 11/1992 |
| JP | 5-152523 | 6/1993 |
| JP | 8-130249 | 5/1996 |
| JP | 11-68053 | 3/2002 |
| JP | 2002-252333 | 9/2002 |
| KR | 2001-0040186 | 5/2001 |

* cited by examiner

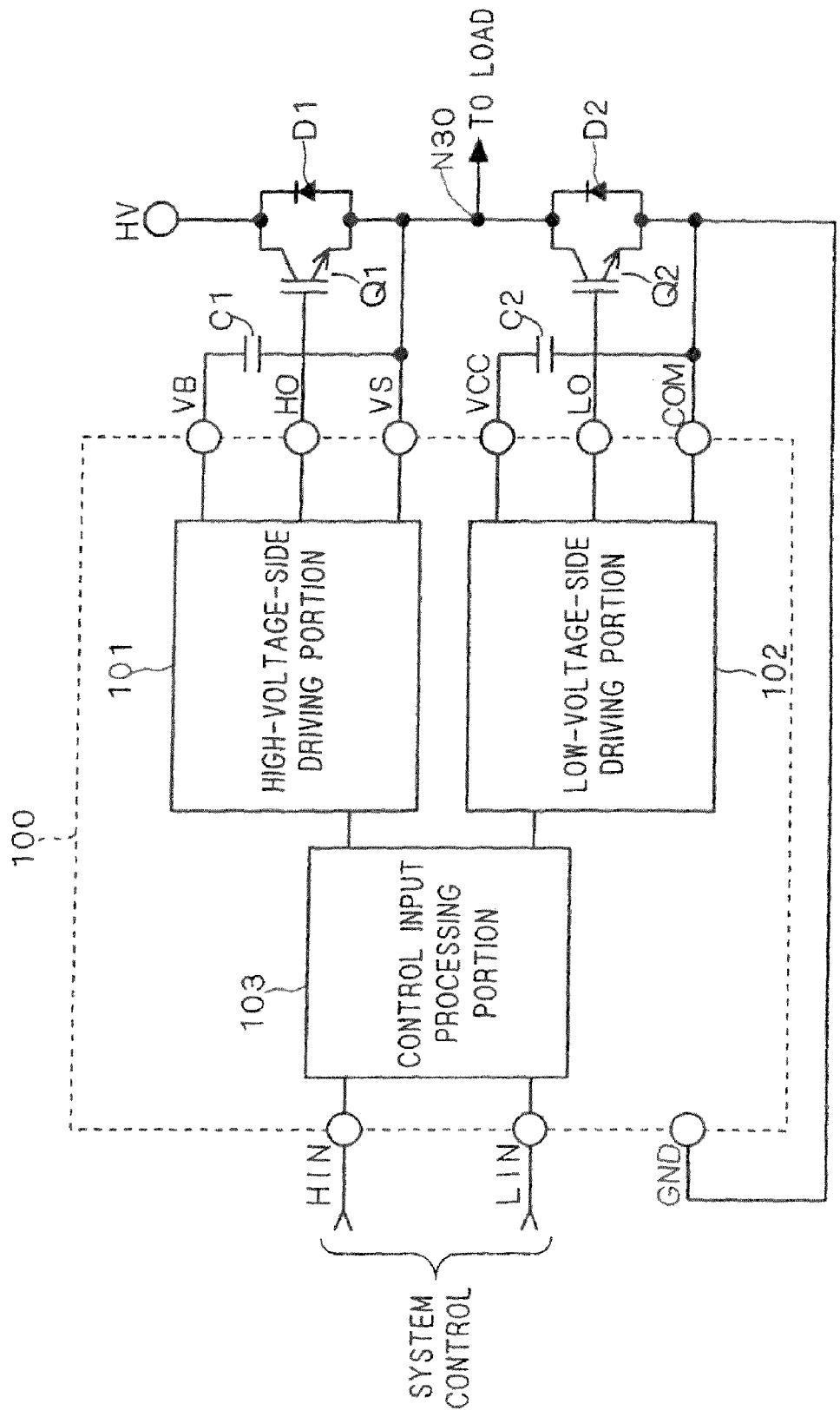
F I G. 1

F I G . 2
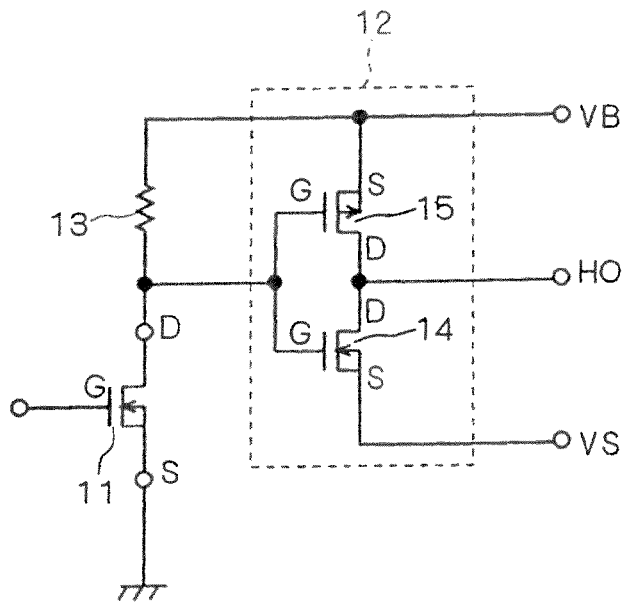
F I G . 3
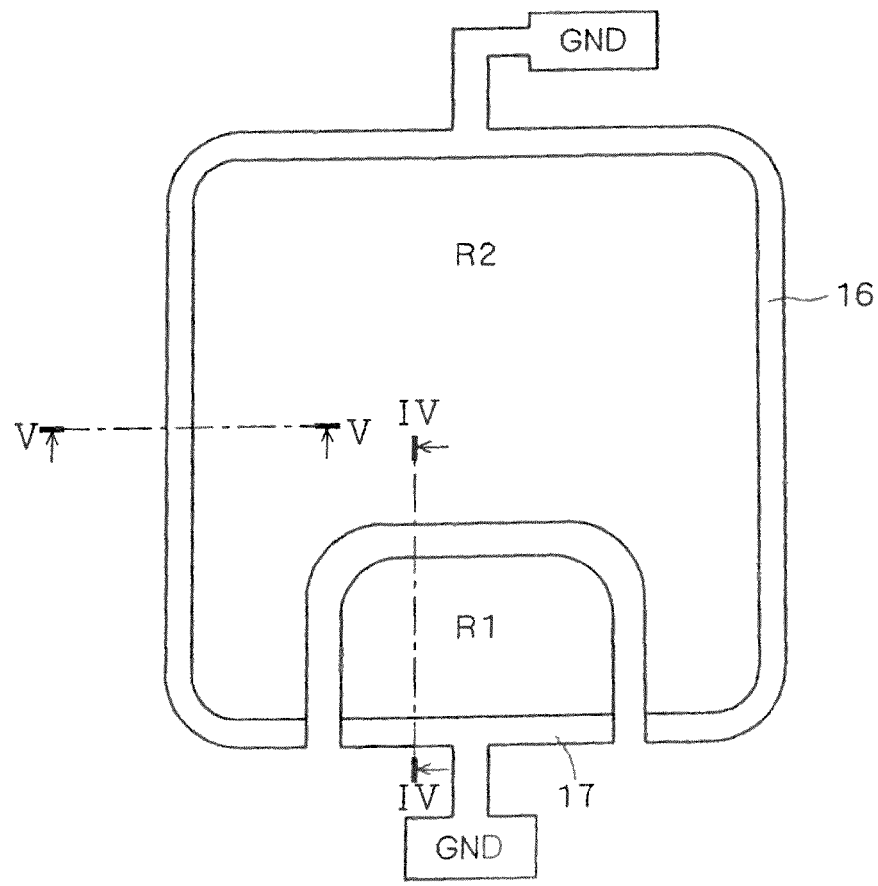

F I G. 12
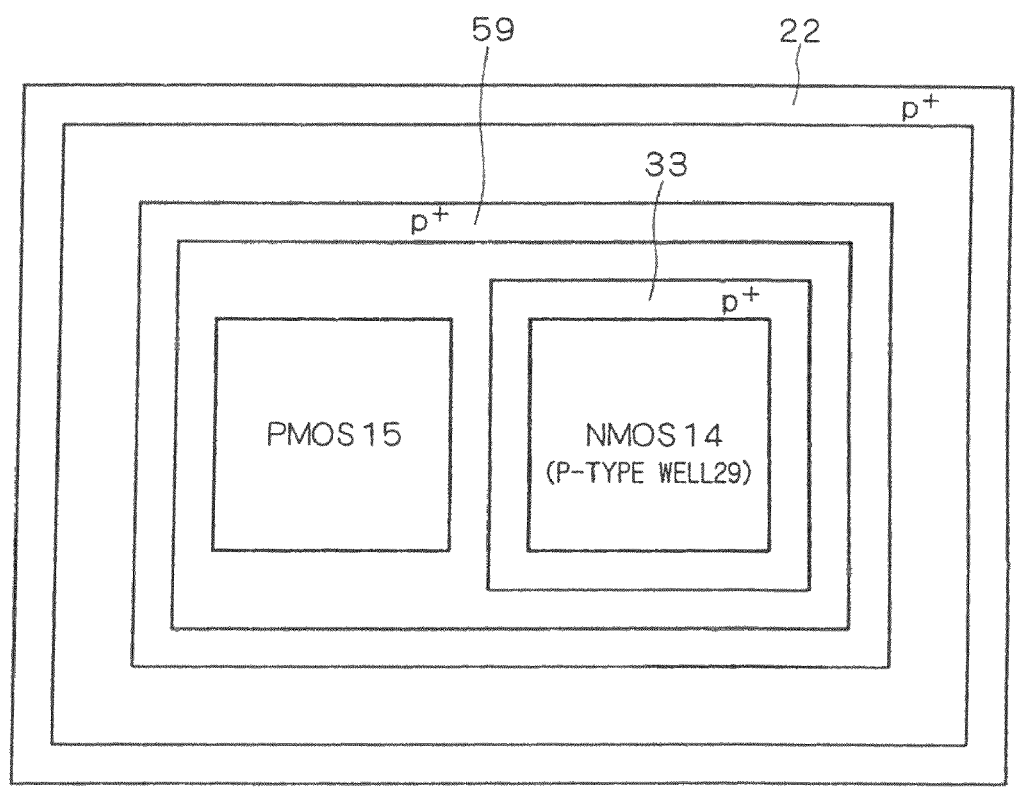

SEMICONDUCTOR DEVICE CAPABLE OF AVOIDING LATCHUP BREAKDOWN RESULTING FROM NEGATIVE VARIATION OF FLOATING OFFSET VOLTAGE

This application is Division of and claims the benefit of priority under 35 U.S.C. §120 from U.S. Ser. No. 11/623,806, filed Jan. 17, 2007, which is a Division of U.S. Ser. No. 11/229,724, filed Sep. 20, 2005 (now U.S. Pat. No. 7,190,034), which is a Division of U.S. Ser. No. 10/762,340, filed Jan. 23, 2004 (now U.S. Pat. No. 6,979,850) and claims the benefit of priority under 35 U.S.C. §119 from Japanese Patent Application No. 2003-087822, filed Mar. 27, 2003, the entire contents of each which are incorporated herein by reference.

BACKGROUND OF THE INVENTION

1. Field of the Invention

The present invention relates to semiconductor devices, and particularly to a power device driving device for driving power devices, e.g. inverters.

2. Description of the Background Art

A power device includes series-connected first and second N-channel insulated-gate bipolar transistors (IGBTs) and a power device driving device. The first IGBT has its collector electrode connected to a main power-supply and the second IGBT has its emitter electrode connected to a ground potential. The emitter electrode of the first IGBT and the collector electrode of the second IGBT are connected to a load. Freewheeling diodes are connected in inverse-parallel respectively to the first and second IGBTs in order to protect the first and second IGBTs from counterelectromotive force due to the load.

The power device driving device includes a high-voltage-side driving portion for controlling the first IGBT and a low-voltage-side driving portion for controlling the second IGBT. The power device driving device has a VS terminal connected to the emitter electrode of the first IGBT, a VB terminal connected to the emitter electrode of the first IGBT through a capacitor, an HO terminal connected to the control electrode of the first IGBT, a COM terminal connected to the emitter electrode of the second IGBT, a VCC terminal connected to the emitter electrode of the second IGB0T through a capacitor, an LO terminal connected to the control electrode of the second IGBT, and a GND terminal. VS denotes a high-voltage-side floating offset voltage that serves as a reference potential for the high-voltage-side driving portion. VB is a high-voltage-side floating supply absolute voltage serving as a power-supply for the high-voltage-side driving portion, which is supplied from a high-voltage-side floating power-supply. HO is a high-voltage-side driving signal output by the high-voltage-side driving portion. COM is common ground. VCC is a low-voltage-side fixed supply voltage serving as a power-supply for the low-voltage-side driving portion, which is supplied from a low-voltage-side fixed supply power-supply. LO is a low-voltage-side driving signal output by the low-voltage-side driving portion. GND is a ground potential.

Now, the conventional power device driving device, specifically the high-voltage-side driving portion, is described.

The high-voltage-side driving portion includes a CMOS circuit having PMOS and NMOS transistors. The PMOS transistor has its source electrode connected to the VB terminal, the NMOS transistor has its source electrode connected to the VS terminal, and the PMOS and NMOS transistors have their respective drain electrodes connected to the HO terminal.

Next, the structure of the conventional semiconductor device having the CMOS circuit is described. The semiconductor device has a p⁻-type silicon substrate, an n-type impurity region formed in the upper surface of the p⁻-type silicon substrate, a p-type well formed in the upper surface of the n-type impurity region, n-type source and drain regions of the NMOS transistor that are formed in the upper surface of the p-type well, p-type source and drain regions of the PMOS transistor that are formed in the upper surface of the n-type impurity region, and a p⁺-type isolation region formed in the upper surface of the p⁻-type silicon substrate and in contact with the n-type impurity region.

A channel formation region is defined between the source and drain regions of the NMOS transistor and a gate electrode of the NMOS transistor resides on the channel formation region with a gate insulating film disposed between them. Likewise, a channel formation region is defined between the source and drain regions of the PMOS transistor and a gate electrode of the PMOS transistor resides on the channel formation region with a gate insulating film disposed between them. The source region of the NMOS transistor is connected to the VS terminal and the source region of the PMOS transistor is connected to the VB terminal. The drain regions of the NMOS and PMOS transistors are connected to the HO terminal in common.

Techniques about semiconductor devices having CMOS circuits are disclosed in Japanese Patent Application Laid-Open Nos. 11-68053 (1999), 62-120063 (1987), 60-74560 (1985), and 5-152523 (1993).

In the conventional power device and power device driving device, the high-voltage-side floating offset voltage VS may vary to a negative voltage lower than the common ground COM during regenerative periods (i.e. periods in which freewheeling diodes turn on due to the counterelectromotive force from the load). The negative variation of the high-voltage-side floating offset voltage VS is transmitted to the high-voltage-side floating supply absolute voltage VB through the capacitor and then the potential of the high-voltage-side floating supply absolute voltage VB, too, makes a negative variation.

The negative variation of the high-voltage-side floating supply absolute voltage VB is transmitted to the n-type impurity region. As a result, parasitic diodes between the p⁺-type isolation region and n-type impurity region and parasitic diodes between the p⁻-type silicon substrate and n-type impurity region, which are normally reverse-biased, turn on, which causes current to flow into the n-type impurity region.

Then, in the conventional semiconductor device, the current flowing into the n-type impurity region due to the turning-on of the parasitic diodes, may cause the high-voltage-side driving signal output HO to be logically inverted (malfunction), or may cause a parasitic thyristor to latch up to cause excessive current flow to the CMOS circuit, which may damage the circuitry or parts (latchup breakdown: for more details, refer to Japanese Patent Application Laid-Open No. 2002-252333 by the same applicant).

SUMMARY OF THE INVENTION

An object of the present invention is to provide a semiconductor device capable of avoiding malfunction and latchup breakdown resulting from negative variation of a floating offset voltage.

A first aspect of the invention is related to a semiconductor device for driving a switching device having a first electrode, a second electrode, and a control electrode. According to the first aspect of the invention, the semiconductor device includes a first terminal, a second terminal, a semiconductor substrate of a first conductivity type, a first impurity region of a second conductivity type, a second impurity region of the first conductivity type, a first transistor, a second transistor, and at least one of a third impurity region of the first conductivity type and a fourth impurity region of the second conductivity type. The first terminal is connected to the first electrode. The second terminal is connected to the first electrode through a capacitive element. The first impurity region is formed in a main surface of the semiconductor substrate. The second impurity region is formed in a main surface of the first impurity region. The first transistor has a source/drain region of the second conductivity type that is formed in a main surface of the second impurity region and connected to the first terminal. The second transistor has a source/drain region of the first conductivity type that is formed in the main surface of the first impurity region and connected to the second terminal. The third impurity region is formed in the main surface of the first impurity region and connected to the first terminal. The fourth impurity region is formed in the main surface of the first impurity region and connected to the second terminal.

It is thus possible to avoid latchup breakdown resulting from negative variation of the floating offset voltage.

A second aspect of the invention is related to a semiconductor device for driving a switching device having a first electrode, a second electrode, and a control electrode. According to the second aspect, the semiconductor device includes a first terminal, a second terminal, a semiconductor substrate of a first conductivity type, a first impurity region of a second conductivity type, a second impurity region of the first conductivity type, a first transistor, a second transistor, and at least one of a third impurity region of the first conductivity type and a fourth impurity region of the first conductivity type. The first terminal is connected to the first electrode. The second terminal is connected to the first electrode through a capacitive element. The first impurity region is formed in a main surface of the semiconductor substrate. The second impurity region is formed in a main surface of the first impurity region. The first transistor has a source/drain region of the second conductivity type that is formed in a main surface of the second impurity region and connected to the first terminal. The second transistor has a source/drain region of the first conductivity type that is formed in the main surface of the first impurity region and connected to the second terminal. The third impurity region is formed in the main surface of the first impurity region and connected to the first terminal. The fourth impurity region is formed in the main surface of the first impurity region and connected to the second terminal.

It is thus possible to avoid latchup breakdown resulting from negative variation of the floating offset voltage.

A third aspect of the invention is related to a semiconductor device for driving a switching device having a first electrode, a second electrode, and a control electrode. According to the third aspect, the semiconductor device includes a first terminal, a second terminal, a semiconductor substrate of a first conductivity type, a first impurity region of a second conductivity type, a second impurity region of the first conductivity type, a first transistor, a second transistor, a third impurity region of the first conductivity type, a trench, and a fourth impurity region of the first conductivity type. The first terminal is connected to the first electrode. The second terminal is connected to the first electrode through a capacitive element. The first impurity region is formed in a main surface of the semiconductor substrate. The second impurity region is formed in a main surface of the first impurity region. The first transistor has a source/drain region of the second conductivity type that is formed in a main surface of the second impurity region and connected to the first terminal. The second transistor has a source/drain region of the first conductivity type that is formed in the main surface of the first impurity region and connected to the second terminal. The third impurity region is formed in the main surface of the first impurity region and connected to the first or second terminal. The trench is formed in the main surface of the first impurity region and extends through the third impurity region. The fourth impurity region is formed in the first impurity region in a portion that defines wall surfaces of the trench and connected to the first or second terminal.

It is thus possible to avoid latchup breakdown resulting from negative variation of the floating offset voltage.

A fourth aspect of the invention is related to a semiconductor device for driving a switching device having a first electrode, a second electrode, and a control electrode. According to the fourth aspect of the invention, the semiconductor device includes a first terminal, a second terminal, a semiconductor substrate of a first conductivity type, a first impurity region of a second conductivity type, a second impurity region of the first conductivity type, a first transistor, a second transistor, and at least one of a combination of a third impurity region of the first conductivity type and a fourth impurity region of the second conductivity type, and a combination of a fifth impurity region of the second conductivity and a sixth impurity region of the first conductivity. The first terminal is connected to the first electrode. The second terminal is connected to the first electrode through a capacitive element. The first impurity region is formed in a main surface of the semiconductor substrate. The second impurity region is formed in a main surface of the first impurity region. The first transistor has a source/drain region of the second conductivity type that is formed in a main surface of the second impurity region and connected to the first terminal. The second transistor has a source/drain region of the first conductivity type that is formed in the main surface of the first impurity region and connected to the second terminal. The third impurity region is formed in the main surface of the second impurity region and connected to the first terminal. The fourth impurity region is formed in the main surface of the second impurity region and in contact with the third impurity region and is connected to the first terminal. The fifth impurity region is formed in the main surface of the first impurity region and connected to the second terminal. The sixth impurity region is formed in the main surface of the first impurity region and in contact with the fifth impurity region and is connected to the second terminal.

It is thus possible to avoid latchup breakdown resulting from negative variation of the floating offset voltage.

A fifth aspect of the invention is related to a semiconductor device for driving a switching device having a first electrode, a second electrode, and a control electrode. According to the fifth aspect of the invention, the semiconductor device includes a first terminal, a second terminal, a semiconductor substrate of a first conductivity type, a first impurity region of a second conductivity type, a second impurity region of the first conductivity type, a first transistor, a second transistor, a third impurity region of the first conductivity type, a trench, a fourth impurity region of the first conductivity type, a fifth impurity region of the second conductivity type, and a floating electrode. The first terminal is connected to the first electrode. The second terminal is connected to the first electrode through a capacitive element. The first impurity region is formed in a main surface of the semiconductor substrate. The second impurity region is formed in a main surface of the first impurity region. The first transistor has a source/drain region of the second conductivity type that is formed in a main surface of the second impurity region and connected to the first terminal. The second transistor has a source/drain region of the first conductivity type that is formed in the main surface of the first impurity region and connected to the second terminal. The third impurity region is formed in the main surface of the first impurity region. The trench is formed in the main surface of the first impurity region and extends through the third impurity region. The fourth impurity region is formed in the first impurity region in a portion that defines wall surfaces of the trench. The fifth impurity region is formed in the main surface of the first impurity region and in contact with the third impurity region. The floating electrode is formed in the main surface of the first impurity region and in contact with the third to fifth impurity regions.

It is thus possible to avoid latchup breakdown resulting from negative variation of the floating offset voltage.

A sixth aspect of the invention is related to a semiconductor device for driving a switching device having a first electrode, a second electrode, and a control electrode. According to the sixth aspect of the invention, the semiconductor device includes a first terminal, a second terminal, a first impurity region of a first conductivity type, a second impurity region of a second conductivity type, a first transistor, a second transistor, and a third impurity region of the second conductivity type. The first terminal is connected to the first electrode. The second terminal is connected to the first electrode through a capacitive element. The second impurity region is formed in a main surface of the first impurity region. The first transistor has a source/drain region of the first conductivity type that is formed in a main surface of the second impurity region and connected to the first terminal. The second transistor has a source/drain region of the second conductivity type that is formed in the main surface of the first impurity region and connected to the second terminal. The third impurity region is formed in the main surface of the first impurity region and connected to the first terminal.

It is thus possible to avoid latchup breakdown resulting from negative variation of the floating offset voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic diagram used to describe the structure of a power device and a power device driving device;

FIG. 2 is a circuit diagram showing a main part of the high-voltage-side driving portion;

FIG. 3 is a schematic plan showing the layout on a high-voltage island in the power device driving device;

FIG. 12 is a top view schematically showing the layout of the $p^+$-type impurity region and $p^+$-type impurity region;

DESCRIPTION OF THE PREFERRED EMBODIMENTS

First Preferred Embodiment

Figure 4:
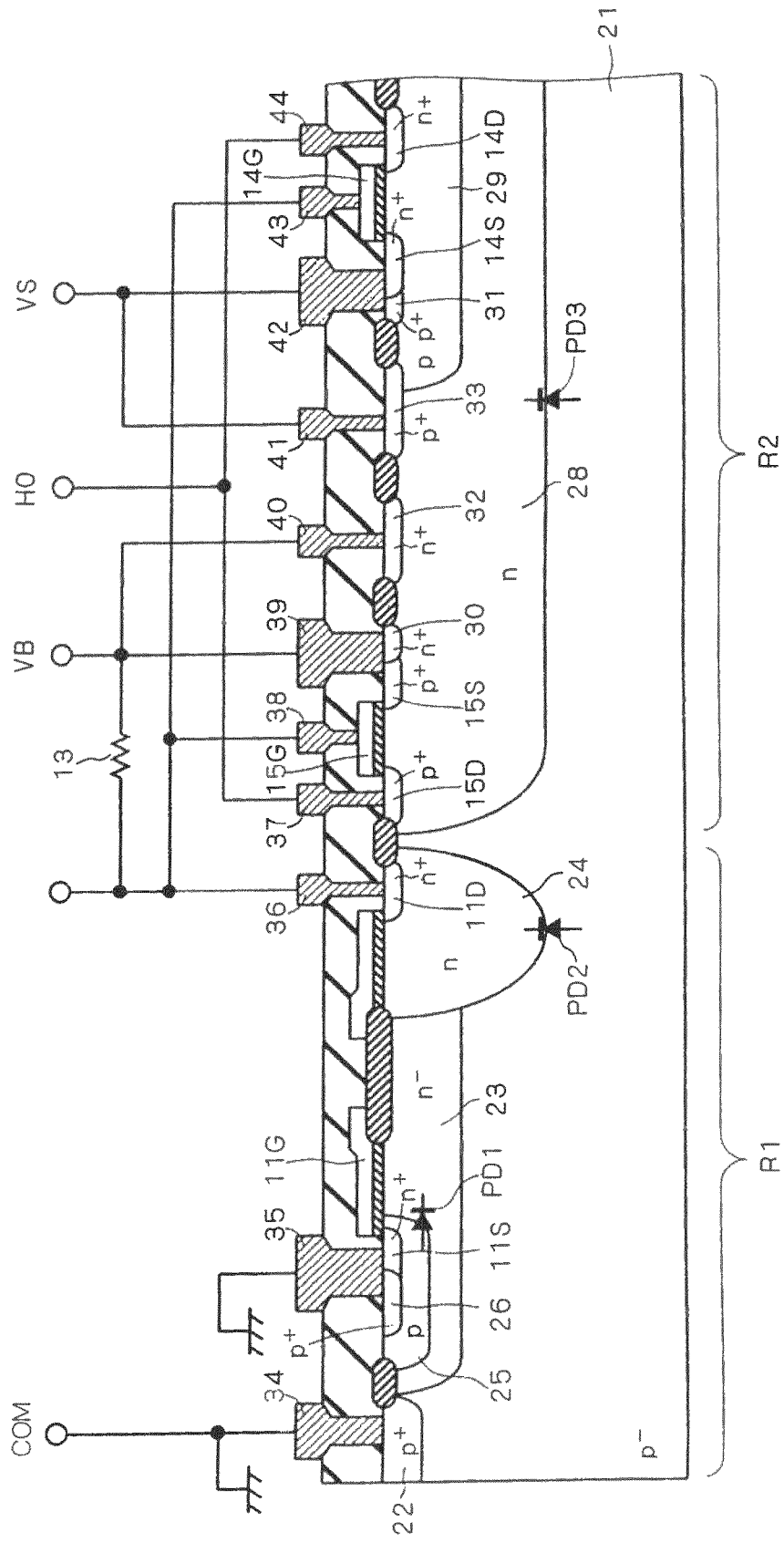
FIGS. 4 and 5 are cross-sectional views showing the structure of a semiconductor device according to a first preferred embodiment of the invention.

FIG. 1 is a schematic diagram illustrating the configuration of a power device and a power device driving device. N-channel insulated-gate bipolar transistors (IGBTs) Q1 and Q2, as power switching devices, switch a high voltage HV or a main power-supply. A load is connected to a node N30. Freewheeling diodes D1 and D2 protect the IGBTs Q1 and Q2 from counterelectromotive force due to the load connected to the node N30.

A power device driving device 100 drives IGBTs Q1 and Q2; the power device driving device 100 operates in accordance with a high-voltage-side control input HIN for controlling IGBT Q1 and a low-voltage-side control input LIN for controlling IGBT Q2. The power device driving device 100 includes a high-voltage-side driving portion 101 for driving IGBT Q1, a low-voltage-side driving portion 102 for driving IGBT Q2, and a control input processing portion 103.

Now, when IGBTs Q1 and Q2 simultaneously turn on, for example, a through current flows in IGBTs Q1 and Q2 and then no current flows to the load, which is an undesirable condition. The control input processing portion 103, receiving the control inputs HIN and LIN, controls the high-voltage-side driving portion 101 and low-voltage-side driving portion 102 in order to, for example, prevent such an undesirable condition.

Also, the power device driving device 100 has a VS terminal connected to the emitter electrode of IGBT Q1, a VB terminal connected to the emitter electrode of IGBT Q1 through a capacitor C1, an HO terminal connected to the control electrode of IGBT Q1, a COM terminal connected to the emitter electrode of IGBT Q2, a VCC terminal connected through a capacitor C2 to the emitter electrode of IGBT Q2, an LO terminal connected to the control electrode of IGBT Q2, and a GND terminal. VS denotes a high-voltage-side floating offset voltage that serves as a reference potential for the high-voltage-side driving portion 101. VB is a high-voltage-side floating supply absolute voltage serving as a power-supply for the high-voltage-side driving portion 101, which is supplied from a high-voltage-side floating power-supply not shown. HO is a high-voltage-side driving signal output by the high-voltage-side driving portion 101. COM is common ground. VCC is a low-voltage-side fixed supply voltage serving as a power-supply for the low-voltage-side driving portion 102, which is supplied from a low-voltage-side fixed supply power-supply not shown. LO is a low-voltage-side driving signal output by the low-voltage-side driving portion 102. GND is a ground potential.

The capacitors C1 and C2 are provided to cause the power-supply voltages supplied to the high-voltage-side driving portion 101 and low-voltage-side driving portion 102 to follow potential variations caused by the operation of the power device.

With this configuration, the main power-supply is switched by the power device on the basis of the control inputs HIN and LIN.

Now, since the high-voltage-side driving portion 101 operates in a potential-floating condition with respect to the circuit ground potential GND, the configuration has a level shift circuit for transmitting the driving signal to the high-voltage-side circuit.

FIG. 2 is a circuit diagram showing the main part of the high-voltage-side driving portion 101 in the power device driving device 100. A high-breakdown-voltage MOS 11, a switching element, serves as the level shift circuit mentioned above. A CMOS circuit (hereinafter referred to as CMOS) 12, a switching component for the high-voltage-side driving signal output, includes a PMOS transistor (hereinafter referred to as PMOS) 15 and an NMOS transistor (hereinafter referred to as NMOS) 14; the CMOS circuit 12 outputs the high-voltage-side driving signal HO. A level shift resistor 13, for setting the gate potential for the CMOS 12, serves as pull-up resistance.

The high-breakdown-voltage MOS 11 switches the CMOS 12 in accordance with the high-voltage-side control input HIN. The CMOS 12 switches the voltage between the high-voltage-side floating supply absolute voltage VB and the high-voltage-side floating offset voltage VS and outputs a driving signal to the high-voltage-side driving signal output HO, thereby driving the high-voltage-side switching element of the external power device.

In the description below, the CMOS 12 and level shift resistor 13 are referred to together as a high-voltage-side driving circuit.

FIG. 3 is a schematic plan showing the layout of a high-voltage island in the power device driving device 100. The high-voltage-side driving circuit, including CMOS 12 and level shift resistor 13, is formed within a region R2 that is called a high-voltage island, with the high-breakdown-voltage MOS 11 formed in a region R1. Aluminum lines 16 and 17, for ground potential GND, surround and shield them.

Figure 5:
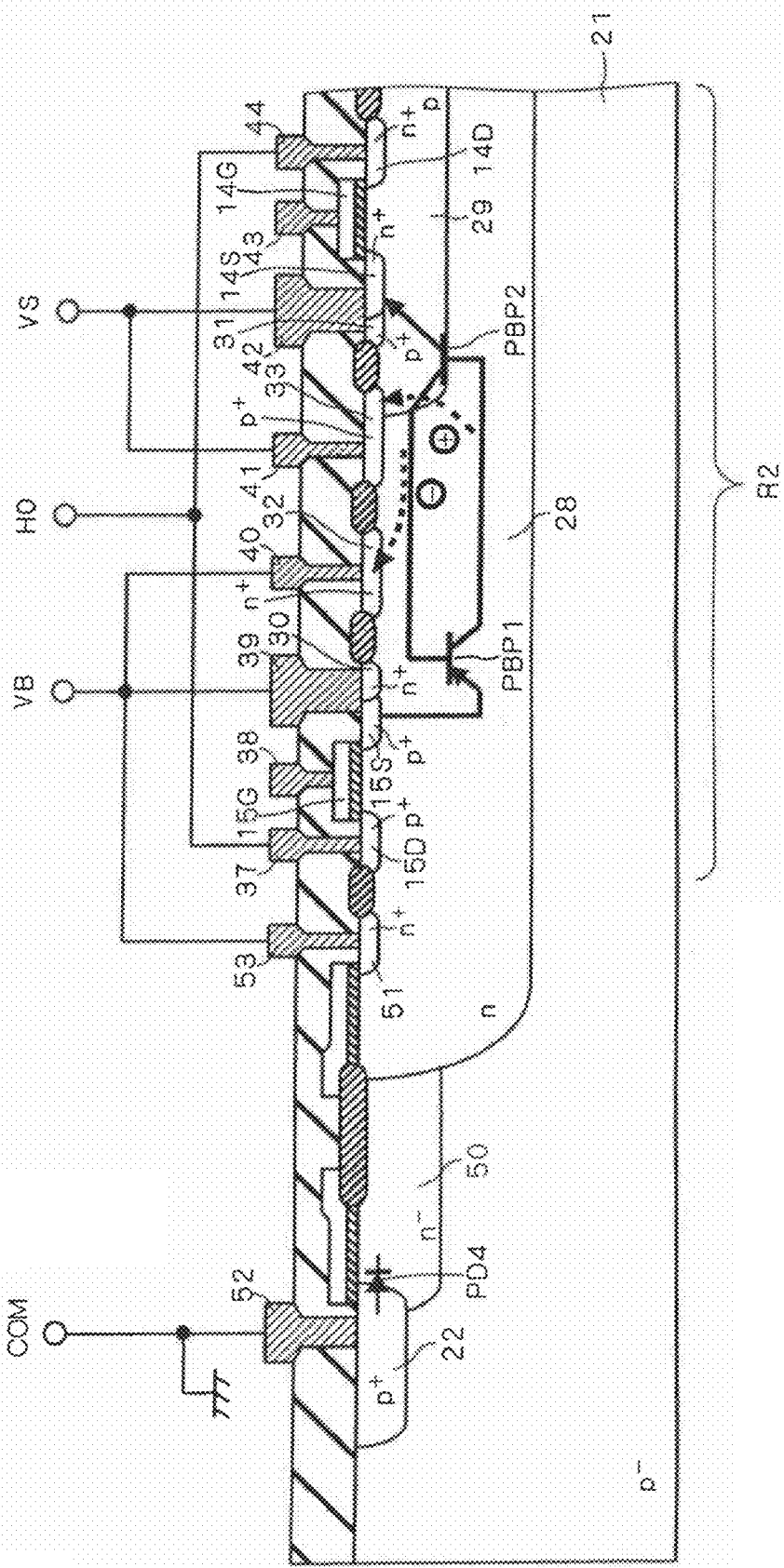

FIGS. 4 and 5 are cross-sectional views showing the structure of the semiconductor device of a first preferred embodiment of the invention, which are the cross-sections taken respectively along lines IV-IV and V-V in FIG. 3. Referring to FIG. 4, in the upper surface of a p$^-$-type silicon substrate 21, a p$^+$-type isolation region 22, an n$^-$-type impurity region 23, and n-type impurity regions 24 and 28 are formed. A p-type well 29 is formed in the upper surface of the n-type impurity region 28. The p$^+$-type isolation region 22 reaches the p$^-$-type silicon substrate 21. An electrode 34 resides on the p$^+$-type isolation region 22 and the potential at the p$^-$-type silicon substrate 21 is the lowest in the circuit (GND or COM potential). A p-type well 25 is formed under an n$^+$-type source region 11S of the high-breakdown-voltage MOS 11; the p-type well 25 extends under the gate electrode 11G with a gate insulating film disposed between them and forms the channel region of the high-breakdown-voltage MOS 11. In the p-type well 25, a p$^+$-type impurity region 26 and the n$^+$-type source region 11S are in contact with the source electrode 35. Also, an n$^+$-type drain region 11D is formed in contact with the drain electrode 36 of the high-breakdown-voltage MOS 11.

The drain electrode 36 of the high-breakdown-voltage MOS 11 is connected to the gate electrodes 15G and 14G of PMOS 15 and NMOS 14 of CMOS 12, and also connected to the source electrode 39 of PMOS 15 and the high-voltage-side floating supply absolute voltage VB through the level shift resistor 13.

In the n-type impurity region 28 where CMOS 12 is formed, a p$^+$-type source region 15S and an n$^+$-type impurity region 30 are formed in contact with the source electrode 39 of PMOS 15, and a p$^+$-type drain region 15D is formed in contact with the drain electrode 37. On the upper surface of the n-type impurity region 28, the gate electrode 15G of PMOS 15 is formed with a gate insulating film disposed between them. An electrode 38 resides on the gate electrode 15G. NMOS 14 is formed within the p-type well 29, with an n$^+$-type drain region 14D formed in contact with the drain electrode 44 of NMOS 14 and with an n$^+$-type source region 14S and a p$^+$-type impurity region 31 in contact with the source electrode 42. On the upper surface of the p-type well 29, the gate electrode 14G of the NMOS 14 resides with a gate insulating film disposed between them. An electrode 43 resides on the gate electrode 14G.

In the upper surface of the n-type impurity region 28, a p$^+$-type impurity region 33 is formed between the NMOS 14 and PMOS 15 and in contact with the p-type well 29. An electrode 41 resides on the p$^+$-type impurity region 33 and the electrode 41 is connected to the high-voltage-side floating offset voltage VS. The p$^+$-type impurity region 33 has a higher impurity concentration than the p-type well 29, and the p$^+$-type impurity region 33 is shallower than the p-type well 29. Between the p$^+$-type impurity region 33 and PMOS 15, an n$^+$-type impurity region 32 is formed in the upper surface of the n-type impurity region 28. An electrode 40 resides on the n$^+$-type impurity region 32 and the electrode 40 is connected to the high-voltage-side floating supply absolute voltage VB.

Referring to FIG. 5, in the upper surface of the p$^-$-type silicon substrate 21, the p$^+$-type isolation region 22, an n$^-$-type impurity region 50, and the n-type impurity region 28 are present. An electrode 52 resides on the p$^+$-type isolation region 22. An n$^+$-type impurity region 51 is formed in the upper surface of the n-type impurity region 28 and an electrode 53 is formed on the n$^+$-type impurity region 51. The electrode 53 is connected to the high-voltage-side floating supply absolute voltage VB.

As shown in FIG. 5, the p$^+$-type source region 15S, n-type impurity region 28, p-type well 29, and n$^+$-type source region 14S form a lateral parasitic thyristor. The parasitic thyristor is formed of a pnp-type parasitic bipolar transistor PBP1 and an npn-type parasitic bipolar transistor PBP2.

Figure 6:
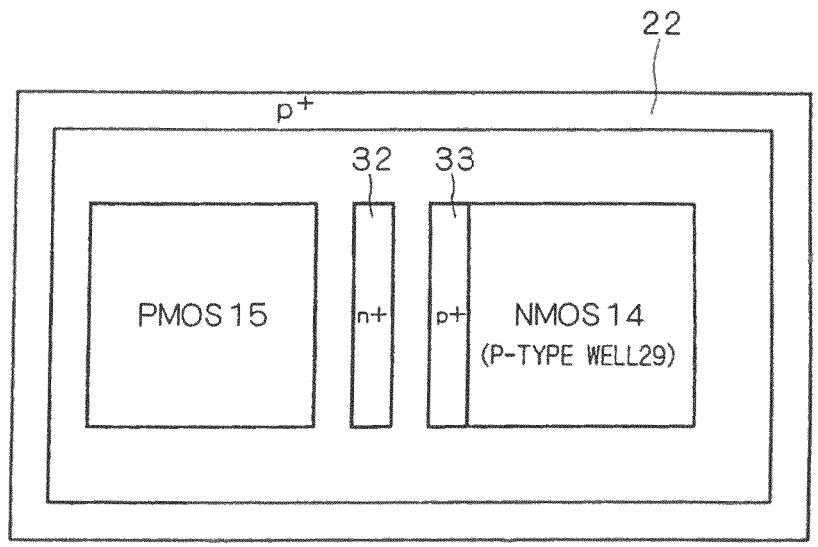
FIGS. 6 and 7 are top views schematically showing examples of the layout of the $n^+$-type impurity region and $p^+$-type impurity region.
Figure 7:
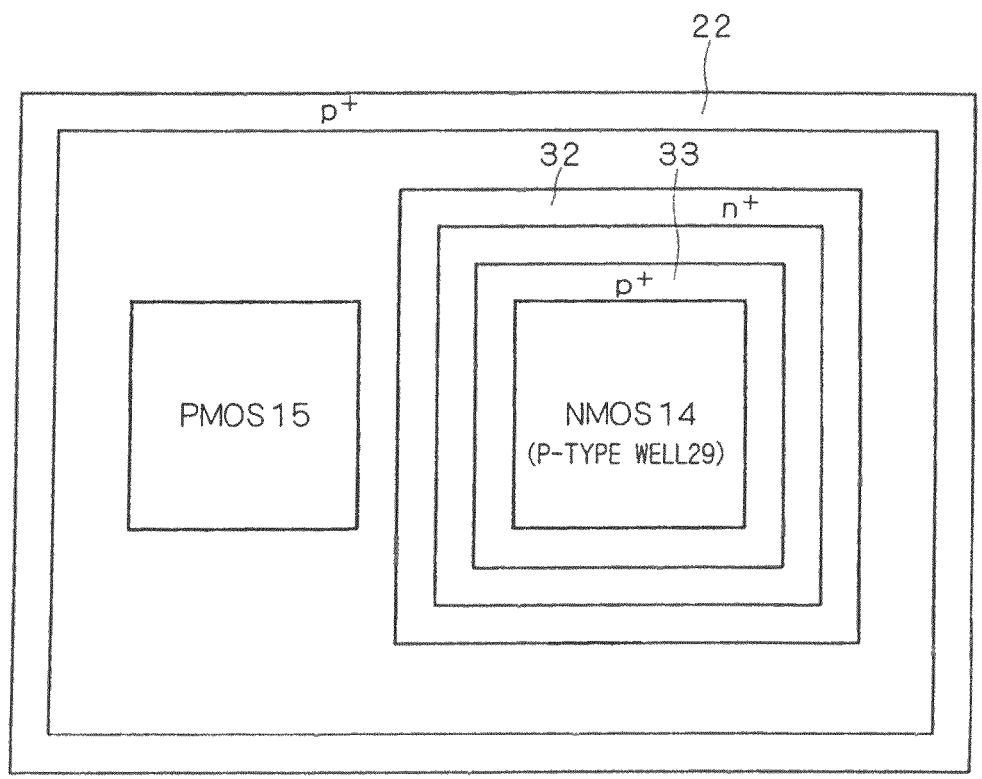

FIGS. 6 and 7 are top views schematically showing examples of the layout of the n$^+$-type impurity region 32 and p$^+$-type impurity region 33. The p$^+$-type isolation region 22 is formed to squarely surround the regions R1 and R2 as shown in FIG. 3. In the example of FIG. 6, the n$^+$-type impurity region 32 and p$^+$-type impurity region 33 are formed between opposite, or facing, sides of the NMOS 14 and PMOS 15. In the example of FIG. 7, the p$^+$-type impurity region 33 surrounds the p-type well 29 and the n$^+$-type impurity region 32 surrounds the p-type well 29 between the p$^+$-type isolation region 22 and the p-type well 29. Furthermore, in the specification, the terms "form to surround" includes not only the case of forming to surround continuously, but also the case of forming to surround intermittently. The example shown in FIG. 6 enables a smaller chip size than that of FIG. 7.

In the power device and power device driving device of the first preferred embodiment, suppose that, during a regenerative period, the high-voltage-side floating offset voltage VS has varied to a negative voltage lower than the common ground COM. In this case, the negative variation of the high-voltage-side floating offset voltage VS is transmitted to the high-voltage-side floating supply absolute voltage VB through the capacitor C1 shown in FIG. 1, which causes the high-voltage-side floating supply absolute voltage VB to make a negative potential variation. Referring to FIGS. 4 and 5, the negative variation of the high-voltage-side floating supply absolute voltage VB is transmitted to the n$^-$-type impurity regions 23 and 50 and the n-type impurity regions 24 and 28. As a result, the parasitic diodes PD1-PD4, which are normally reverse-biased, turn on, causing current to flow into the n$^-$-type impurity region 23 and the n-type impurity regions 24 and 28.

However, according to the semiconductor device of the first preferred embodiment, electrons corresponding to the base current of the parasitic bipolar transistor PBP1 are absorbed by the n$^+$-type impurity region 32 that is at higher potential than the high-voltage-side floating offset voltage VS. The base current of the parasitic bipolar transistor PBP1 is thus suppressed and the parasitic thyristor does not turn on, so that latchup breakdown of the CMOS 12 can be avoided.

Figure 8:
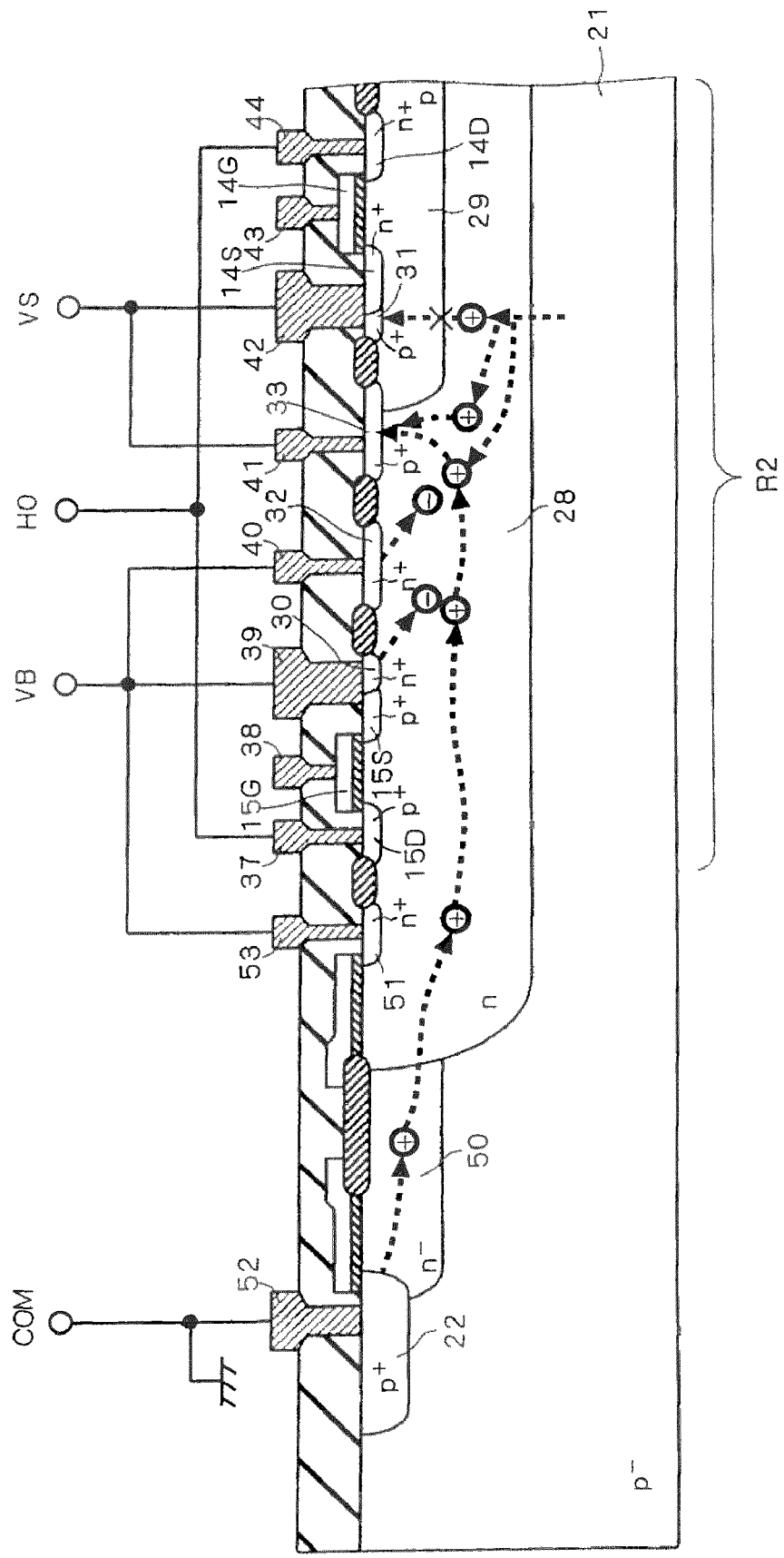
FIG. 8 is a cross-sectional view used to describe effects of the semiconductor device of the first preferred embodiment of the invention.

Also, holes corresponding to the base current of the parasitic bipolar transistor PBP2 are absorbed by the p$^+$-type impurity region 33 that is at lower potential than the high-voltage-side floating supply absolute voltage VB. The base current of the parasitic bipolar transistor PBP2 is thus suppressed and the parasitic thyristor does not turn on, so that latchup breakdown of the CMOS 12 can be avoided. Referring to FIG. 8, the hole current flowing from the p$^+$-type isolation region 22 into the n$^-$-type impurity region 50 is absorbed by the p$^+$-type impurity region 33 before reaching the p-type well 29. Also, the hole current flowing into the n-type impurity region 28 from the p$^-$-type silicon substrate 21 right under the p-type well 29 is attracted by electrons that are injected from the n$^+$-type impurity regions 30, 32 into the n-type impurity region 28, and is absorbed by the p$^+$-type impurity region 33 instead of flowing into the p-type well 29.

As shown in FIG. 5, the p$^+$-type impurity region 33 is formed shallower than the p-type well 29. Therefore the electric field strength of the curvature portion of the p$^+$-type impurity region 33 is higher than the electric field strength of the curvature portion of the p-type well 29. This allows the p$^+$-type impurity region 33 to absorb larger hole current, making it possible to more effectively avoid latchup breakdown of the CMOS 12.

As stated earlier, the impurity concentration of the p$^+$-type impurity region 33 is higher than the impurity concentration of the p-type well 29. Therefore the electric field strength of the curvature portion of the p$^+$-type impurity region 33 is higher than the electric field strength of the curvature portion of the p-type well 29. Furthermore, increasing the impurity concentration of the p$^+$-type impurity region 33 reduces the sheet resistance in the p$^+$-type impurity region 33 and the contact resistance between the p$^+$-type impurity region 33 and electrode 41. This allows the p$^+$-type impurity region 33 to absorb larger hole current, making it possible to more effectively avoid latchup breakdown of the CMOS 12.

As shown in FIG. 5, the p$^+$-type impurity region 33 is formed in contact with the p-type well 29 that corresponds to the base layer of the parasitic bipolar transistor PBP2. Thus, the chip size can be smaller than when a gap is present between the p$^+$-type impurity region 33 and p-type well 29; furthermore, since the resistance of the base layer of the parasitic bipolar transistor PBP2 is reduced, the p$^+$-type impurity region 33 can absorb larger hole current, which more effectively avoids latchup breakdown of the CMOS 12.

The largest part of the current that flows into the n-type impurity region 28 because of negative variation of the high-voltage-side floating offset voltage VS is the current flowing from the p$^+$-type isolation region 22 into the n-type impurity region 28 through the n$^-$-type impurity region 50. Therefore, particularly when the p$^+$-type isolation region 22 is formed to surround the regions R1 and R2, forming, as shown in FIG. 7, the p$^+$-type impurity region 33 and n$^+$-type impurity region 32 surrounding the p-type well 29 more effectively avoids latchup breakdown of the CMOS 12.

Though forming both n$^+$-type impurity region 32 and p$^+$-type impurity region 33 is the most effective, forming just one of them is also effective.

Second Preferred Embodiment

Figure 9:
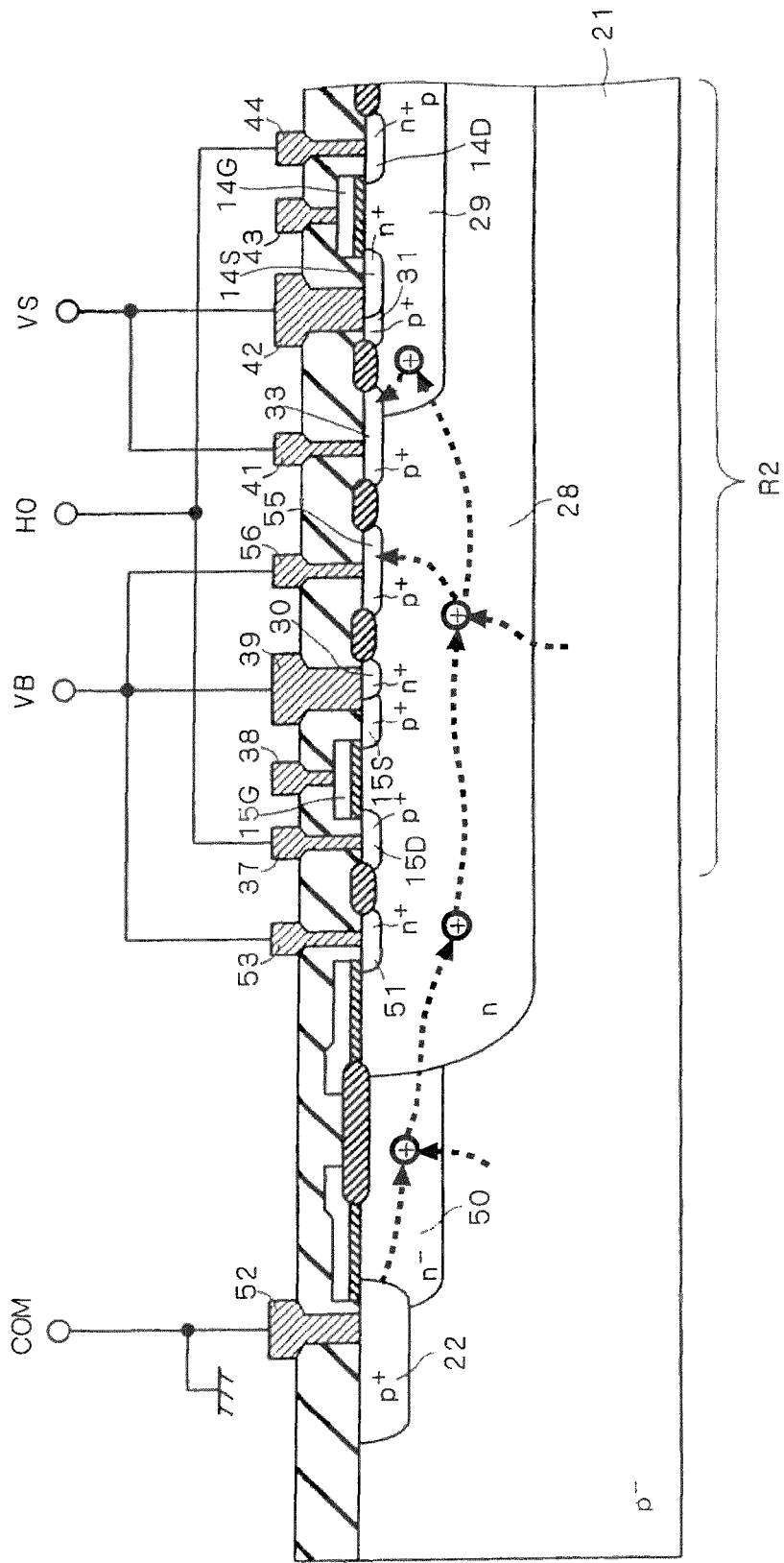
FIG. 9 is a cross-sectional view showing the structure of a semiconductor device according to a second preferred embodiment of the invention.

FIG. 9 is a cross-sectional view showing the structure of a semiconductor device according to the a second preferred embodiment of the invention: FIG. 9 is associated with FIG. 5. The n$^+$-type impurity region 32 and electrode 40 shown in FIG. 5 are replaced by a p$^+$-type impurity region 55 and an electrode 56. The electrode 56 is connected to the high-voltage-side floating supply absolute voltage VB. The impurity concentration of the p$^+$-type impurity region 55 is higher than the impurity concentration of the p-type well 29 and the p$^+$-type impurity region 55 is shallower than the p-type well 29.

As in the example of FIG. 6, the p$^+$-type impurity region 55 is formed between the opposite sides of the NMOS 14 and PMOS 15. Alternatively, as in the example of FIG. 7, the p$^+$-type impurity region 55 is formed between the p$^+$-type isolation region 22 and the p-type well 29 and surrounds the p-type well 29.

With a negative variation of the high-voltage-side floating offset voltage VS, the high-voltage-side floating offset voltage VS and the high-voltage-side floating supply absolute voltage VB become lower than the potential of the p$^-$-type silicon substrate 21 and p$^+$-type isolation region 22. Then, even if the parasitic diodes PD1-PD4 turn on and current flows into the n-type impurity region 28, holes that correspond to the base current of the parasitic bipolar transistor PBP2 shown in FIG. 5 are absorbed by the p$^+$-type impurity regions 55 and 33. The base current of the parasitic bipolar transistor PBP2 is thus suppressed and the parasitic thyristor does not turn on, which avoids latchup breakdown of the CMOS 12.

Furthermore, since the p$^+$-type impurity region 55 replaces the n$^+$-type impurity region 32, when the parasitic diodes PD1-PD4 shown in FIGS. 4 and 5 turn on due to negative variation of the high-voltage-side floating offset voltage VS, no electrons are injected from the p$^+$-type impurity region 55 into the n-type impurity region 28. This reduces the supply of holes from the p$^-$-type silicon substrate 21 and the p$^+$-type isolation region 22 and thus reduces the hole current flowing into the n-type impurity region 28, whereby latchup breakdown of the CMOS 12 can be more effectively prevented.

Although forming both p$^+$-type impurity region 55 and p$^+$-type impurity region 33 is the most effective, forming just one of them is also effective.

Third Preferred Embodiment

Figure 10:
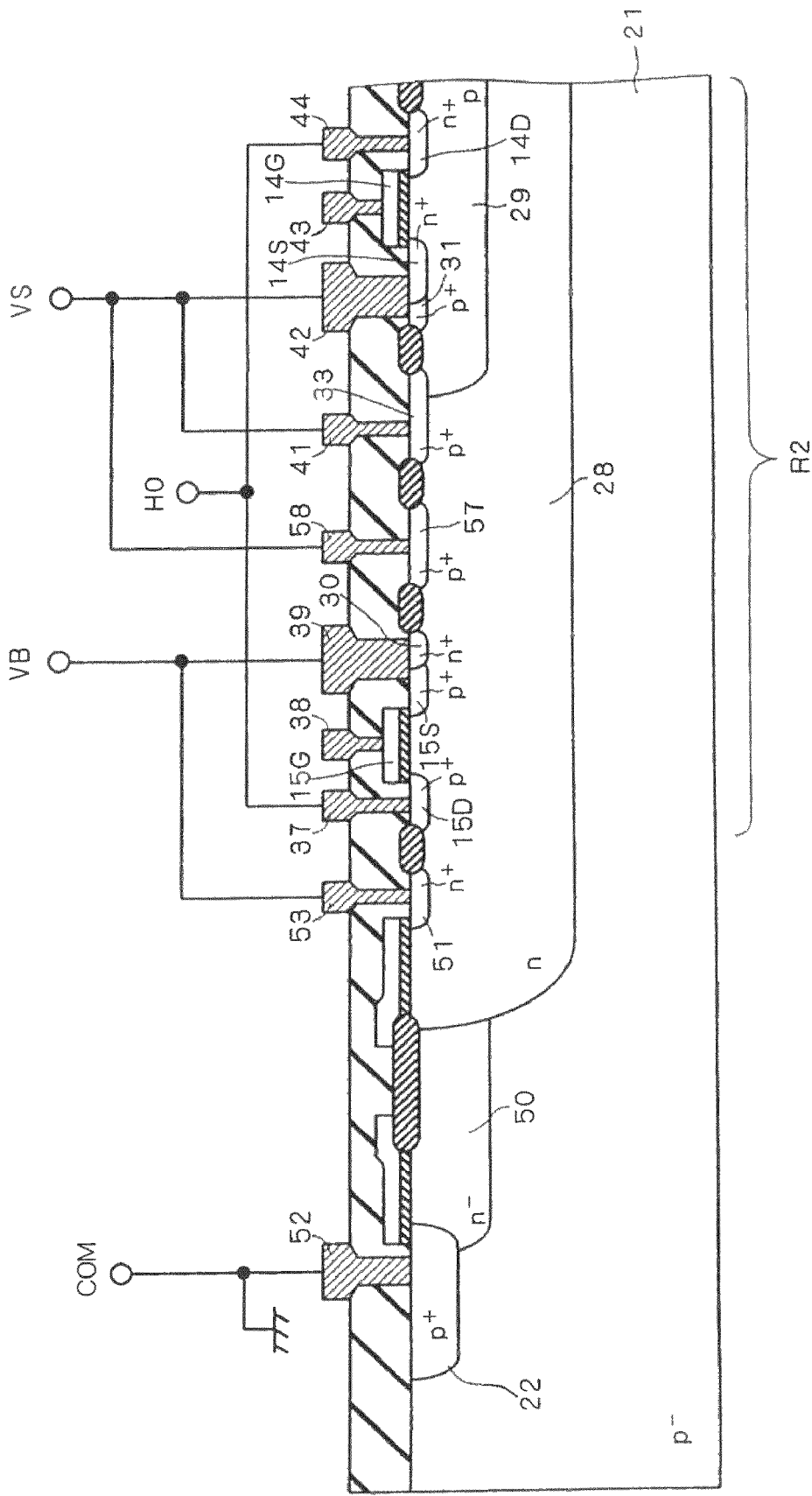
FIG. 10 is a cross-sectional view showing the structure of a semiconductor device according to a third preferred embodiment of the invention.

FIG. 10 is a cross-sectional view showing the structure of a semiconductor device according to a third preferred embodiment of the invention: FIG. 10 is associated with FIG. 5. The n$^+$-type impurity region 32 and electrode 40 shown in FIG. 5 are replaced by a p$^+$-type impurity region 57 and an electrode 58. The electrode 58 is connected to the high-voltage-side floating offset voltage VS. The impurity concentration of the p$^+$-type impurity region 57 is higher than the impurity concentration of the p-type well 29 and the p$^+$-type impurity region 57 is shallower than the p-type well 29.

As in the example of FIG. 6, the p$^+$-type impurity region 57 is formed between the opposite sides of the NMOS 14 and PMOS 15. Alternatively, as in the example of FIG. 7, the p$^+$-type impurity region 57 is formed between the p$^+$-type isolation region 22 and the p-type well 29 and surrounds the p-type well 29.

With a negative variation of the high-voltage-side floating offset voltage VS, the high-voltage-side floating offset voltage VS and high-voltage-side floating supply absolute voltage VB become lower than the potential of the p$^-$-type silicon substrate 21 and p$^+$-type isolation region 22. Then, even if the parasitic diodes PD1-PD4 turn on and current flows into the n-type impurity region 28, holes that correspond to the base current of the parasitic bipolar transistor PBP2 shown in FIG. 5 are absorbed by the p$^+$-type impurity regions 57 and 33. The base current of the parasitic bipolar transistor PBP2 is thus suppressed and the parasitic thyristor does not turn on, which avoids latchup breakdown of the CMOS 12.

Furthermore, since the p$^+$-type impurity regions 57 and 33 are both connected to the high-voltage-side floating offset voltage VS and are at the same potential, the pnp-type parasitic bipolar transistor formed by the p$^+$-type impurity region 57, n-type impurity region 28, and p$^+$-type impurity region 33 does not operate. Thus, malfunction of the high-voltage-side driving portion 101, resulting from operation of this parasitic bipolar transistor, can be avoided.

Although forming both p$^+$-type impurity region 57 and p$^+$-type impurity region 33 is the most effective, forming just one of them is also effective.

Fourth Preferred Embodiment

Figure 11:
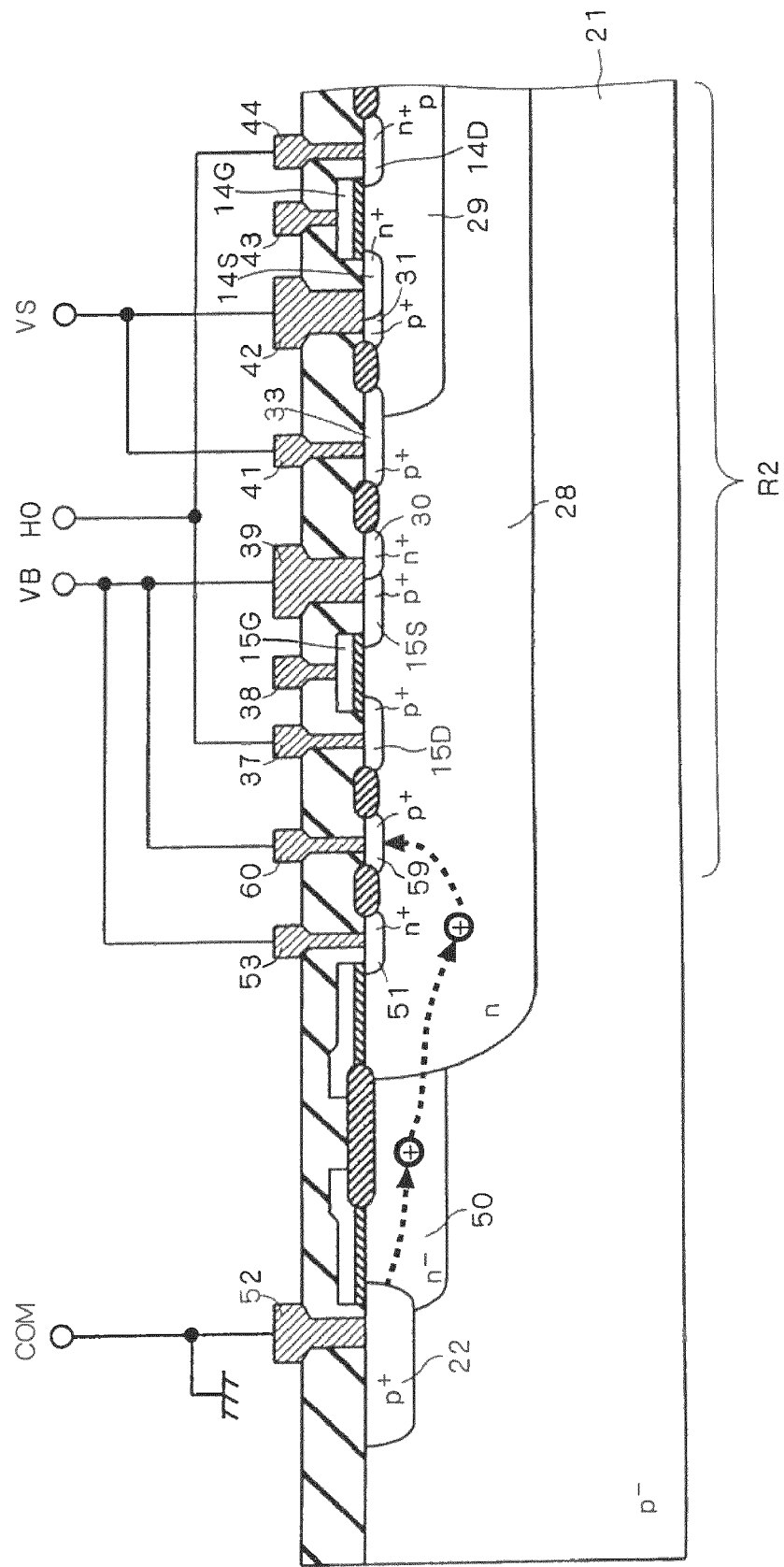
FIG. 11 is a cross-sectional view showing the structure of a semiconductor device according to a fourth preferred embodiment of the invention.

FIG. 11 is a cross-sectional view showing the structure of a semiconductor device according to a fourth preferred embodiment of the invention: FIG. 11 is associated with FIG. 5. The n$^+$-type impurity region 32 and electrode 40 shown in FIG. 5 are replaced by a p$^+$-type impurity region 59 and an electrode 60. The electrode 60 is connected to the high-voltage-side floating supply absolute voltage VB. The p$^+$-type impurity region 59 is formed between the p$^+$-type drain region 15D and the n$^+$-type impurity region 51.

FIG. 12 is a top view schematically showing the layout of the p$^+$-type impurity region 59 and p$^+$-type impurity region 33. The p$^+$-type isolation region 22 is formed to squarely surround the regions R1 and R2 as shown in FIG. 3. As shown in FIG. 12, the p$^+$-type impurity region 33 is formed to surround the p-type well 29, and the p$^+$-type impurity region 59 is formed between the p$^+$-type isolation region 22 and the p-type well 29 and PMOS 15 and extends in parallel to the p$^+$-type isolation region 22, and thus surrounds the p-type well 29 and PMOS 15.

As mentioned earlier, the largest part of the current that flows into the n-type impurity region 28 because of negative variation of the high-voltage-side floating offset voltage VS is the current flowing from the p$^+$-type isolation region 22 into the n-type impurity region 28 through the n$^-$-type impurity region 50. Therefore, when, as shown in FIG. 12, the p$^+$-type impurity region 59 is formed in parallel to the p$^+$-type isolation region 22, the p$^+$-type impurity region 59 can efficiently absorb holes corresponding to the base current of the parasitic bipolar transistor PBP2 before they flow into the p-type well 29. The base current of the parasitic bipolar transistor PBP2 is thus suppressed and the parasitic thyristor does not turn on, which efficiently avoids latchup breakdown of the CMOS 12.

Although forming both p$^+$-type impurity region 59 and p$^+$-type impurity region 33 is the most effective, forming just one of them is also effective.

Fifth Preferred Embodiment

Figure 13:
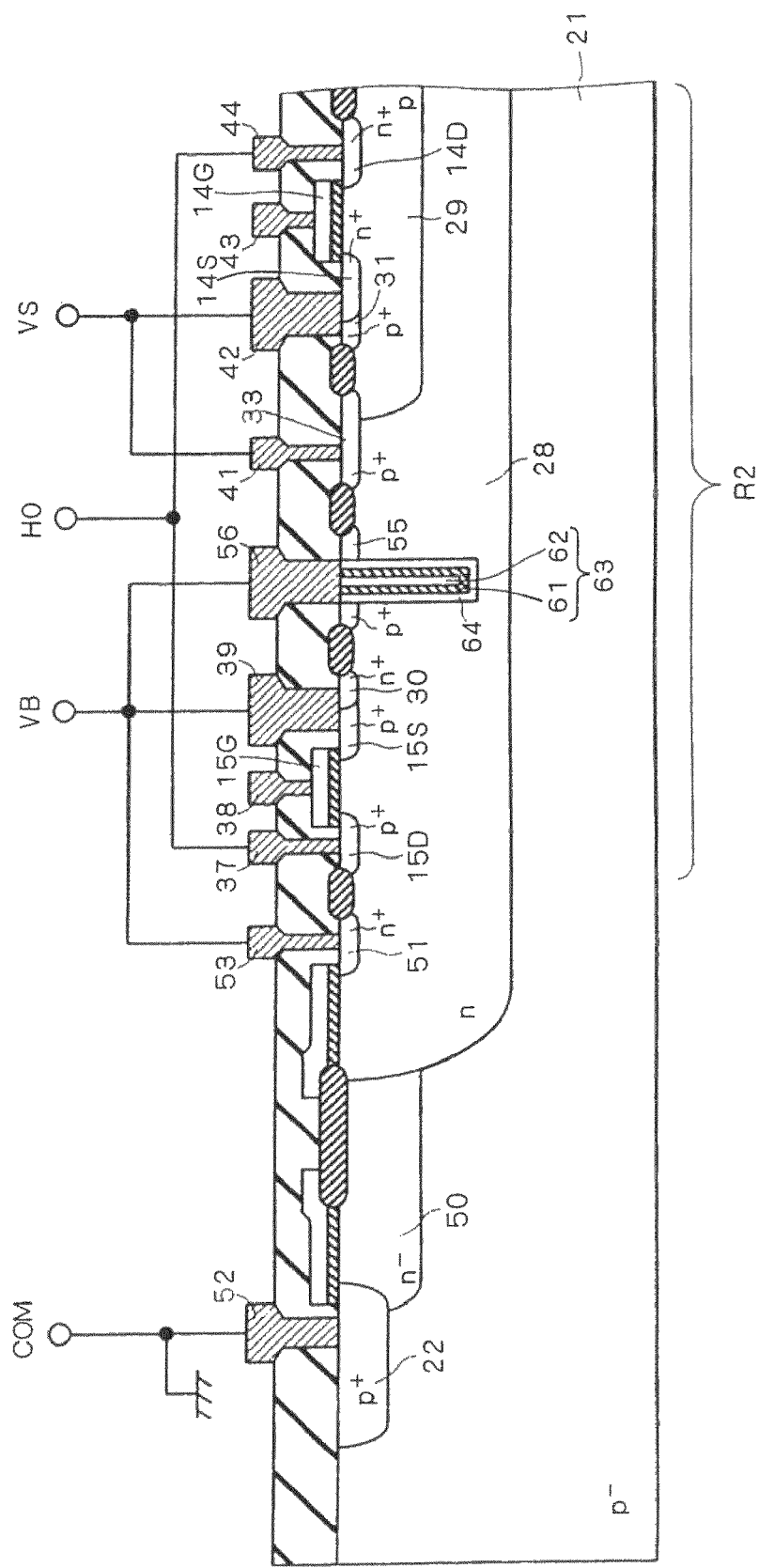
FIG. 13 is a cross-sectional view showing the structure of a semiconductor device according to a fifth preferred embodiment of the invention.

FIG. 13 is a cross-sectional view showing the structure of a semiconductor device according to a fifth preferred embodiment: FIG. 13 is associated with FIG. 9. A trench 63 is formed in the upper surface of the n-type impurity region 28 and extends through the p$^+$-type impurity region 55; the inside of the trench 63 is filled with silicon oxide film 61 and polysilicon 62. Also, p$^+$-type impurity region 64 is formed in the portion of the n-type impurity region 28 that defines wall surfaces of the trench 63. The p$^+$-type impurity region 64 is in contact with the p$^+$-type impurity region 55 and electrode 56.

As in the example of FIG. 6, the p$^+$-type impurity regions 55 and 64 are formed between the opposite sides of the NMOS 14 and PMOS 15. Alternatively, as in the example of FIG. 7, the p$^+$-type impurity regions 55 and 64 are formed between the p$^+$-type isolation region 22 and p-type well 29 and surround the p-type well 29.

As compared with the structure shown in FIG. 9, forming the p$^+$-type impurity region 64 on the wall surfaces of the trench 63 and in contact with the p$^+$-type impurity region 55 enlarges the effective area of the p$^+$-type impurity region 55. Furthermore, the electric field strength at the bottom of the trench 63 is higher than the electric field strength at the curvature portion of the p-type well 29. Thus, as compared with the structure shown in FIG. 9, the p$^+$-type impurity regions 55 and 64 can absorb more of the hole current flowing into the n-type impurity region 28. It is thus possible to more efficiently avoid latchup breakdown of the CMOS 12.

Moreover, since the formation of the p$^+$-type impurity region 64 enhances the efficiency of hole current absorption, the area of the p$^+$-type impurity region 55 can be smaller than in the structure of FIG. 9, which allows the chip to be downsized.

In the example of FIG. 13, the trench 63 is deeper than the p-type well 29. Forming the trench 63 deeper increases the area of the p$^+$-type impurity region 64, thus enhancing the hole current absorption efficiency.

However, when the trench 63 is deeper than 20 µm, then the breakdown voltage is reduced (the voltage at which pn-junction breakdown occurs when voltage is applied in the GND direction with VB and VS shorted). Accordingly, when it is necessary to also satisfy the breakdown voltage characteristic, the reduction in the breakdown voltage can be avoided by setting the depth of the trench 63 at 20 µm or less.

Though forming both p$^+$-type impurity regions 55, 64 and the p$^+$-type impurity region 33 is the most effective, forming just one of them is also effective. Also, though the electrode 56 is connected to the high-voltage-side floating supply absolute voltage VB in the structure of FIG. 13, the electrode 56 may be connected to the high-voltage-side floating offset voltage VS.

Sixth Preferred Embodiment

Figure 14:
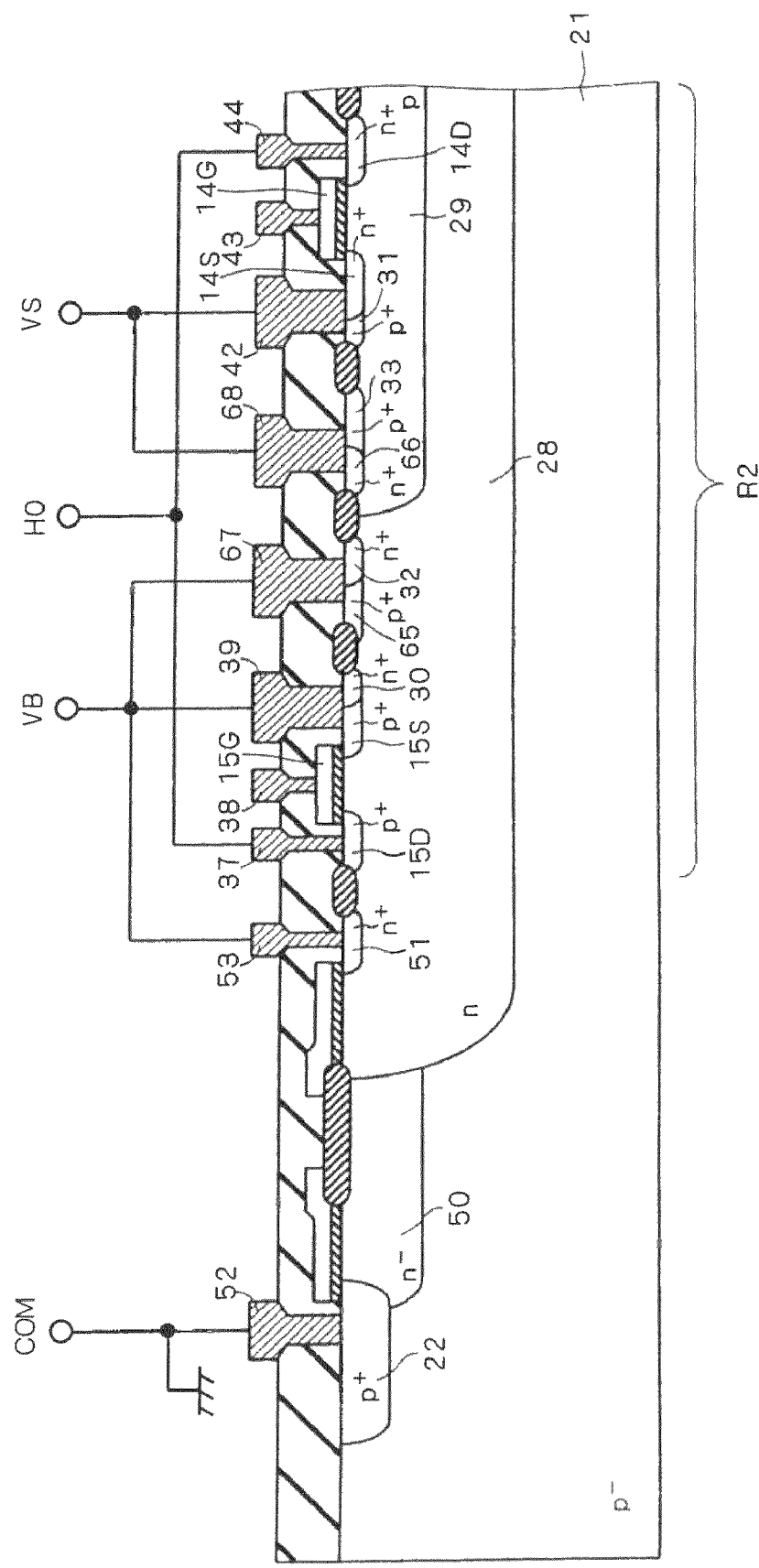
FIG. 14 is a cross-sectional view showing the structure of a semiconductor device according to a sixth preferred embodiment of the invention.

FIG. 14 is a cross-sectional view showing the structure of a semiconductor device according to a sixth preferred embodiment of the invention: FIG. 14 is associated with FIG. 5. An n$^+$-type impurity region 66 is formed in contact with the p$^+$-type impurity region 33, and a p$^+$-type impurity region 65 is formed in contact with the n$^+$-type impurity region 32. The p+-type impurity region 33 and n+-type impurity region 66 are formed in the p-type well 29. The p+-type impurity region 33 and n+-type impurity region 66 are in contact with an electrode 68 and the electrode 68 is connected to the high-voltage-side floating offset voltage VS. The n+-type impurity region 32 and p+-type impurity region 65 are in contact with an electrode 67 and the electrode 67 is connected to the high-voltage-side floating supply absolute voltage VB.

As in the example of FIG. 6, the p+-type impurity region 33 and n+-type impurity region 66, and the n+-type impurity region 32 and p+-type impurity region 65, are formed between the opposite sides of the NMOS 14 and PMOS 15. Alternatively, as in the example of FIG. 7, the p+-type impurity region 33 and n+-type impurity region 66 are formed along the perimeter of the p-type well 29, and the n+-type impurity region 32 and p+-type impurity region 65 are formed between the p+-type isolation region 22 and the p-type well 29 and surround the p-type well 29.

In the p+-type impurity region 33 that is in contact with the n+-type impurity region 66, holes absorbed by the p+-type impurity region 33 can instantaneously recombine with electrons in the n+-type impurity region 66 and disappear. Also, in the n+-type impurity region 32 that is in contact with the p+-type impurity region 65, electrons absorbed by the n+-type impurity region 32 can instantaneously recombine with holes in the p+-type impurity region 65 and disappear. Thus, the efficiency of absorption of holes by the p+-type impurity region 33 and the efficiency of absorption of electrons by the n+-type impurity region 32 are improved as compared with the structure shown in FIG. 5.

While the above description has shown an application of the sixth preferred embodiment to the first preferred embodiment, the sixth preferred embodiment is applicable also to all other preferred embodiments.

Seventh Preferred Embodiment

Figure 15:
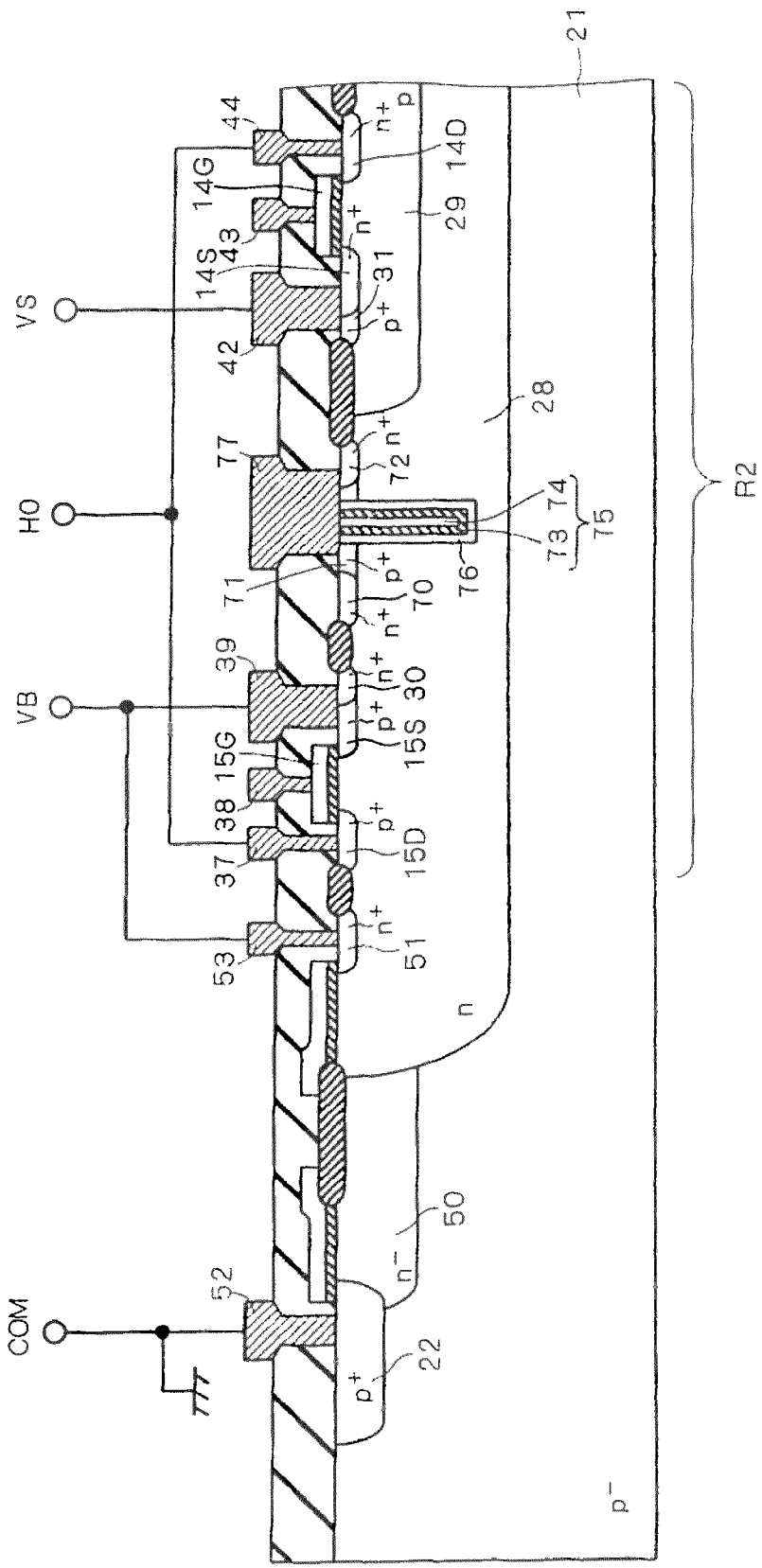
FIG. 15 is a cross-sectional view showing the structure of a semiconductor device according to a seventh preferred embodiment of the invention.

FIG. 15 is a cross-sectional view showing the structure of a semiconductor device according to a seventh preferred embodiment of the invention: FIG. 15 is associated with FIG. 5. Between the NMOS 14 and PMOS 15, a p+-type impurity region 71 is formed in the upper surface of the n-type impurity region 28. Between the p+-type impurity region 71 and the NMOS 14, an n+-type impurity region 72 is formed in contact with the p+-type impurity region 71. Between the p+-type impurity region 71 and the PMOS 15, an n+-type impurity region 70 is formed in contact with the p+-type impurity region 71.

A trench 75 is formed in the upper surface of the n-type impurity region 28 and extends through the p+-type impurity region 71; the inside of the trench 75 is filled with silicon oxide film 73 and polysilicon 74. Also, a p+-type impurity region 76 is formed in the portion of the n-type impurity region 28 that defines wall surfaces of the trench 75. The p+-type impurity region 76 is in contact with the p+-type impurity region 71.

On the upper surface of the n-type impurity region 28, a floating electrode 77 resides in contact with the p+-type impurity regions 71 and 76. In the example of FIG. 15, the floating electrode 77 is in contact with the n+-type impurity region 72, without being in contact with the n+-type impurity region 70. However, note that the floating electrode 77 may be in contact with the n+-type impurity region 70 without being in contact with the n+-type impurity region 72, or may be in contact with both of the n+-type impurity regions 70 and 72.

As in the example of FIG. 6, the p+-type impurity regions 71 and 76 and n+-type impurity regions 70 and 72 are formed between the opposite sides of the NMOS 14 and PMOS 15. Alternatively, as in the example of FIG. 7, the p+-type impurity regions 71 and 76 and n+-type impurity regions 70 and 72 are formed between the p+-type isolation region 22 and the p-type well 29 and surround the p-type well 29.

With the p+-type impurity regions 71 and 76 and n+-type impurity regions 70 and 72 being connected to the floating electrode 77, the PN short effect lowers the potential of the p+-type impurity regions 71 and 76 to cause them to absorb holes in the vicinity, and increases the potential of the n+-type impurity regions 70 and 72 to cause them to absorb electrons in the vicinity. Then holes and electrons recombine and disappear by metal short that has an infinitely great recombination rate. Thus, holes and electrons that have flowed into the n-type impurity region 28 due to negative variation of the high-voltage-side floating offset voltage VS are absorbed respectively by the p+-type impurity regions 71 and 76 and the n+-type impurity regions 70 and 72 and disappear, whereby latchup breakdown of the CMOS 12 is avoided.

Also, forming the p+-type impurity region 76, which is in contact with the p+-type impurity region 71, on the wall surfaces of the trench 75 enlarges the effective area of the p+-type impurity region 71. Furthermore, the electric field strength at the bottom of the trench 75 is higher than the electric field strength at the curvature portion of the p-type well 29. Thus, the p+-type impurity regions 71 and 76 can absorb more of the hole current flowing into the n-type impurity region 28. It is thus possible to more efficiently avoid latchup breakdown of the CMOS 12.

While one of the n+-type impurity regions 70 and 72 may be omitted, forming both is more effective.

In the example of FIG. 15, the trench 75 is deeper than the p-type well 29. Forming the trench 75 deeper increases the area of the p+-type impurity region 76 and thus enhances the hole current absorption efficiency.

However, when the trench 75 is deeper than 20 μm, the breakdown voltage is reduced. Accordingly, when it is necessary to also satisfy the breakdown voltage characteristic, the reduction in breakdown voltage can be avoided by setting the depth of the trench 75 at 20 μm or less.

Eighth Preferred Embodiment

In the semiconductor devices of the first to seventh preferred embodiments, energy levels, serving as intentionally controlled recombination centers, are introduced and utilized to cause accumulated carriers to recombine and disappear. For example, crystal defects are formed throughout the depth direction of the p−-type silicon substrate 21 by electron-beam radiation and annealing, platinum diffusion, or gold diffusion and the crystal defects are utilized as carrier lifetime killer.

According to the semiconductor device of the eighth preferred embodiment, the carrier lifetime of the parasitic diodes PD1-PD4 shown in FIGS. 4 and 5 is shortened. This reduces the amount of carriers accumulated in the parasitic diodes PD1-PD4, which reduces the forward current and suppresses the reverse recovery current of the parasitic diodes PD1-PD4. This enhances the tolerance for malfunction caused by negative variations of the high-voltage-side floating offset voltage VS.

Also, forming carrier lifetime killer reduces the hole current flowing into the n-type impurity region 28 due to negative variation of high-voltage-side floating offset voltage VS, which avoids latchup breakdown of the CMOS 12.

Ninth Preferred Embodiment

The eighth preferred embodiment forms crystal defects by electron-beam radiation and annealing, platinum diffusion, or gold diffusion. However, since this method forms crystal defects all through the depth direction of the p$^-$-type silicon substrate 21, the leakage current of NMOS 14 and PMOS 15 may increase. Also, since electron-beam radiation induces plus charge in the gate oxide films of the high-breakdown-voltage MOS 11, NMOS 14 and PMOS 15, the gate-source threshold voltage characteristics may vary.

Accordingly, in the semiconductor devices of the first to seventh preferred embodiments, the ninth preferred embodiment forms crystal defects at a given depth in the p$^-$-type silicon substrate 21 (in a position deeper than the channel regions of high-breakdown-voltage MOS 11, NMOS 14 and PMOS 15) by helium radiation and annealing, or proton radiation and annealing, and utilizes the crystal defects as carrier lifetime killer. Helium radiation and proton radiation induce crystal defects intensively in the vicinity of the range of ions (the depth to which ions penetrate in silicon). It is thus possible to locally control the carrier lifetime in the depth direction of the p$^-$-type silicon substrate 21.

The semiconductor device of the ninth preferred embodiment provides effects to avoid the increase in leakage current and the variation in threshold voltage, in addition to the effects provided by the eighth preferred embodiment.

Tenth Preferred Embodiment

Figure 16:
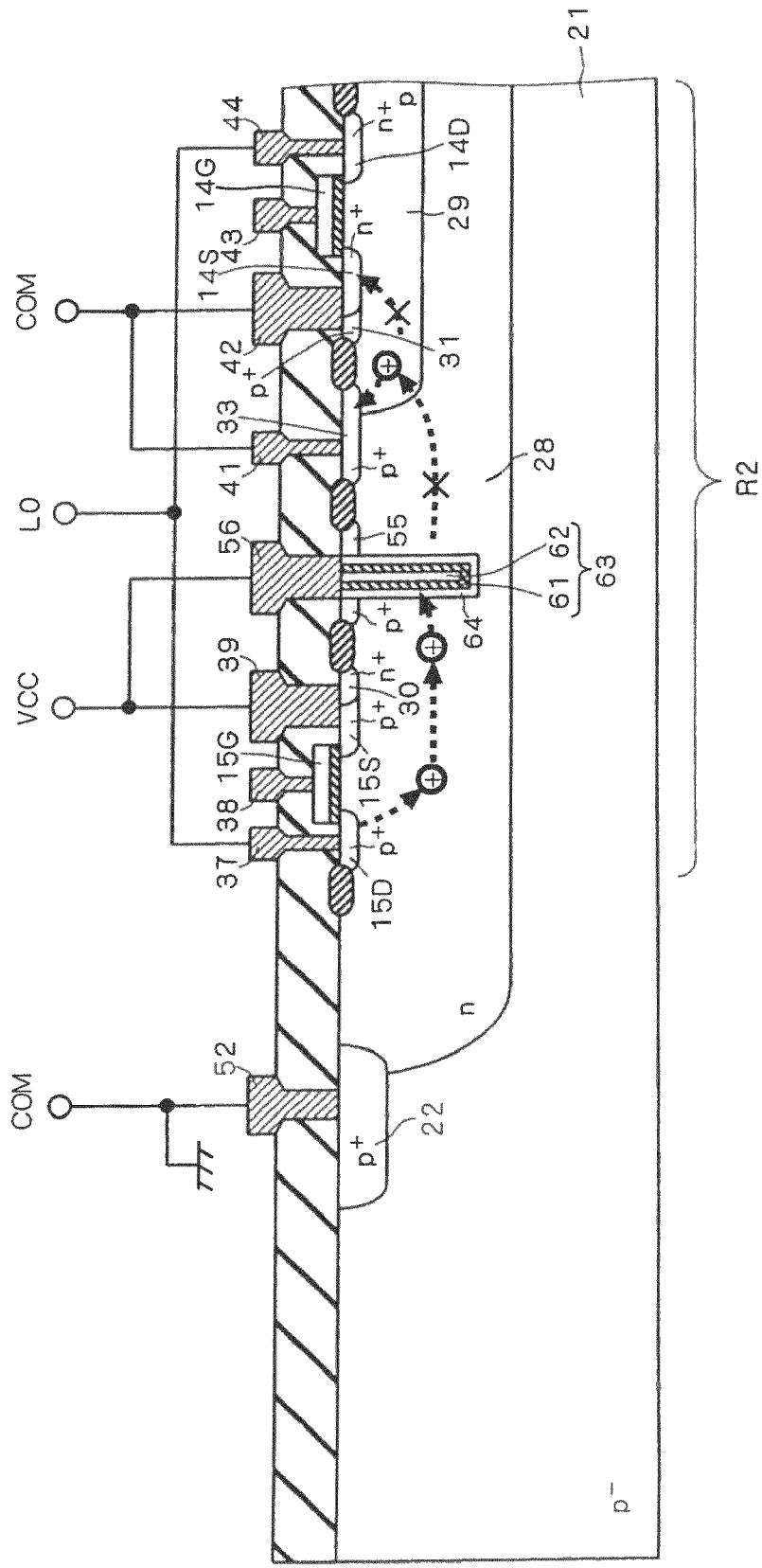
FIG. 16 is a cross-sectional view showing the structure of a semiconductor device according to a tenth preferred embodiment of the invention.

FIG. 16 is a cross-sectional view showing the structure of a semiconductor device according to a tenth preferred embodiment of the invention: FIG. 16 is associated with FIG. 5. While the first to ninth preferred embodiments have described the structure of the high-voltage-side driving portion 101, the first to ninth preferred embodiments can be applied also to the low-voltage-side driving portion 102 as shown in FIG. 16.

In the low-voltage-side driving portion 102, a thyristor is parasitically formed by the p$^+$-type source region 15S, n-type impurity region 28, p-type well 29, and n$^+$-type source region 14S. When a surge voltage higher than the VCC voltage is applied to the output terminal LO, then holes flow into the n-type impurity region 28 from the p$^+$-type drain region 15D that is connected to the output terminal LO, which hole current flows into the p-type well 29. Then the parasitic bipolar transistor formed by the n-type impurity region 28, p-type well 29 and n$^+$-type source region 14S operates to possibly cause latchup of the parasitic thyristor.

However, when the first to ninth preferred embodiments are applied, e.g. when p$^+$-type impurity regions 33, 55, 64 are formed as shown in FIG. 16, then the p$^+$-type impurity regions 55 and 64 absorb the hole current flowing from the p$^+$-type drain region 15D into the n-type impurity region 28 before it flows into the p-type well 29 and the p$^+$-type impurity region 33 absorbs the hole current flowing into the p-type well 29. Latchup of the parasitic thyristor can thus be avoided.

While the invention has been described in detail, the foregoing description is in all aspects illustrative and not restrictive. It is understood that numerous other modifications and variations can be devised without departing from the scope of the invention.

What is claimed is:

1. A semiconductor device for driving a switching device having a first electrode, a second electrode, and a control electrode, said semiconductor device comprising:
   a first terminal connected to said first electrode;
   a second terminal connected to said first electrode through a capacitive element;
   a semiconductor substrate having a first conductivity type;
   a first impurity region formed in a main surface of said semiconductor substrate and having a second conductivity type;
   a second impurity region formed in a main surface of said first impurity region and having said first conductivity type;
   a first transistor having a source/drain region of said second conductivity type, said source/drain region of said first transistor being formed in a main surface of said second impurity region and connected to said first terminal;
   a second transistor having a source/drain region of said first conductivity type, said source/drain region of said second transistor being formed in the main surface of said first impurity region and connected to said second terminal;
   a third impurity region formed in said main surface of said first impurity region and having said first conductivity type;
   a trench formed in said main surface of said first impurity region and extending through said third impurity region;
   a fourth impurity region having said first conductivity type and formed in said first impurity region in a portion that defines wall surfaces of said trench;
   a fifth impurity region having said second conductivity type and formed in said main surface of said first impurity region and in contact with said third impurity region; and
   a floating electrode formed on said main surface of said first impurity region and in contact with said third to fifth impurity regions.

2. The semiconductor device according to claim 1, further comprising an isolation region having said first conductivity type and formed in said main surface of said semiconductor substrate and in contact with said first impurity region,
   wherein said third to fifth impurity regions are formed between said isolation region and said second impurity region and surround said second impurity region continuously or intermittently.

3. The semiconductor device according to claim 1, further comprising a sixth impurity region formed in said main surface of said first impurity region and having said second conductivity type, said sixth impurity region being in contact with said third impurity region on a side opposite to said fifth impurity region.

4. The semiconductor device according to claim 1, wherein said trench is deeper than said second impurity region.

5. A semiconductor device for driving a switching device having a first electrode, a second electrode, and a control electrode, said semiconductor device comprising:
   a first terminal connected to said first electrode;
   a second terminal connected to said first electrode through a capacitive element;
   a first impurity region having a first conductivity type;
   a second impurity region formed in a main surface of said first impurity region and having a second conductivity type;
   a first transistor having a source/drain region of said first conductivity type, said source/drain region of said first transistor being formed in a main surface of said second impurity region and connected to said first terminal;

a second transistor having a source/drain region of said second conductivity type, said source/drain region of said second transistor being formed in the main surface of said first impurity region and connected to said second terminal; and a third impurity region formed in said main surface of said first impurity region, having said second conductivity type, and connected to said first terminal.

\* \* \* \* \*